(12) United States Patent
Chen et al.

(10) Patent No.: US 8,517,657 B2
(45) Date of Patent: Aug. 27, 2013

(54) CORNER CHAMBER WITH HEATER

(75) Inventors: Jinliang Chen, Fremont, CA (US); Noe D. Taburaza, Union City, CA (US)

(73) Assignee: WD Media, LLC, San Jose, CA (US)

( * ) Notice: Subject to any disclaimer, the term of this patent is extended or adjusted under 35 U.S.C. 154(b) by 385 days.

(21) Appl. No.: 12/828,135

(22) Filed: Jun. 30, 2010

(65) Prior Publication Data

US 2012/0003062 A1 Jan. 5, 2012

(51) Int. Cl.
*B65G 25/00* (2006.01)

(52) U.S. Cl.
USPC ........... 414/172; 414/147; 414/158; 414/153; 219/553

(58) Field of Classification Search
USPC .......... 414/147, 149, 158, 153, 172; 219/553
See application file for complete search history.

(56) References Cited

U.S. PATENT DOCUMENTS

| | | | |
|---|---|---|---|
| 4,604,179 A | 8/1986 | Eltoukhy et al. | |
| 5,174,880 A | 12/1992 | Bourez et al. | |
| 5,693,199 A | 12/1997 | Bourez et al. | |
| 5,759,281 A * | 6/1998 | Gurary et al. | 118/725 |
| 5,795,451 A | 8/1998 | Tan et al. | |
| 5,925,227 A | 7/1999 | Kobayashi et al. | |
| 6,176,932 B1 * | 1/2001 | Watanabe et al. | 118/719 |
| 6,455,101 B1 | 9/2002 | Sasaki et al. | |
| 7,185,122 B2 | 2/2007 | Nishioka | |
| 2002/0190051 A1 * | 12/2002 | Wang et al. | 219/390 |
| 2009/0151634 A1 | 6/2009 | Watanabe et al. | |

* cited by examiner

*Primary Examiner* — Julio J Maldonado
*Assistant Examiner* — Robert Bachner

(57) ABSTRACT

A disk processing system with a corner chamber having a heater assembly and a carrier rotary assembly configured to rotate the heater assembly.

13 Claims, 8 Drawing Sheets

CORNER CHAMBER WITH HEATER

TECHNICAL FIELD

Embodiments described herein relate to the field of disk processing systems, and, in particularly, to a corner chamber, of a disk processing system, having a heater.

BACKGROUND

Various processing systems are used in the fabrication of magnetic recording disks. One such processing system is the ANELVA C-3050 disk sputtering system, available from Canon ANELVA Corporation of Japan. The ANELVA C-3050 disk sputtering system has sputtering stations, heating stations, cooling stations, loading and unloading stations, and corner stations. A corner station connects two sections of linearly arranged stations being at different orientations to each other (e.g., right angles). The corner stations on the ANELVA C-3050 system include bake heaters that are installed in the ceiling of the chamber. The bake heaters are used during system maintenance to drive moisture out of the mechanical components in the chamber for an improved base pressure in the vacuum of the system.

The bake heaters are not utilized in production operation during processing of media. The ANELVA C-3050 system utilizes a dedicated heating station for heating disks. The use of a dedicated heating station, which takes up the same space as other stations (e.g., a sputtering station), adds to the overall footprint of the disk sputtering system and, thereby, the cost of a sputtering system.

BRIEF DESCRIPTION OF THE DRAWINGS

The present invention is illustrated by way of example, and not limitation, in the figures of the accompanying drawings in which.

DETAILED DESCRIPTION

Embodiments of a method are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding. In other instances, well-known manufacturing processes and equipment have not been described in particular detail to avoid unnecessarily obscuring the claimed subject matter. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment. Furthermore, the particular features, structures, materials, or characteristics may be combined in any suitable manner in one or more embodiments.

Embodiments of a disk processing system with a corner chamber having a heater assembly for heating of disks traveling through the corner chamber during production. In one embodiment, the heater assembly in the corner chamber is coupled with a carrier rotary assembly to rotate the heater assembly about a rotational axis of the carrier rotary assembly while a carrier securing the disks is rotated by the rotary assembly. The development of advanced media usually requires the addition of layers in a film stack of conventional media. The deposition of such additional layers may require additional stations in a disk processing system. Conventional disk processing systems may perform heating operations in one of the linear stations. By utilizing embodiments of the present invention to perform heating of disks in a corner station, a linear station that was previously used for heating operations may be freed for use as a sputtering station or other type of operation. It should be noted that while embodiments of the present invention may be discussed herein in relation to media, or magnetic recording disks, the apparatus and methods discussed herein may also be used with other types of disks, for example, optical recording disks such as a compact disc (CD) and a digital-versatile-disk (DVD). Disk sputtering systems are known in the art; accordingly, further details are not provided herein.

Figure 1:
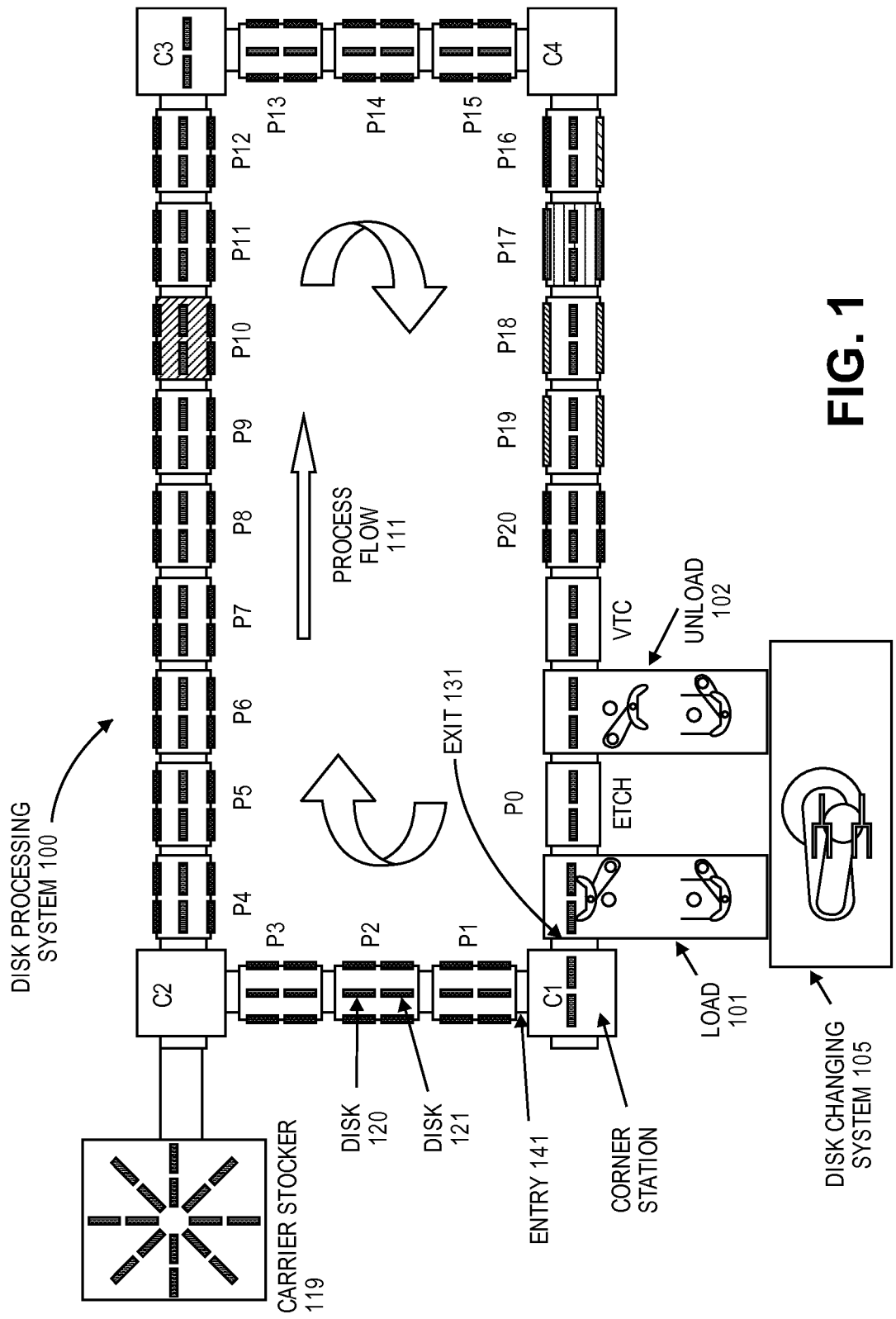
FIG. 1 illustrates a disk processing system with a corner chamber having a heater assembly according to one embodiment of the present invention.

FIG. 1 illustrates a disk processing system with a corner chamber having a heater assembly according to one embodiment of the present invention. Disk processing system 100 includes a plurality of processing chambers situated in different linear sections. Various types of processing chambers may be situated at any of the stations, for example, but not limited to sputter, chemical vapor deposition (CVD), etching, cooling, heating, load, unload, etch, etc. The exemplary embodiment illustrated in FIG. 1 includes process stations P1-P20, corner stations C1-C4, an etch chamber P0, a load chamber 101 and an unload chamber 102. Process stations P1-P3 are located in a first linear section. Process stations P4-P12 are in a second linear section that is perpendicular to the first linear section. Process stations P13-P15 are in a third linear section that is perpendicular to the second linear section. Process stations P16-P20 are in a fourth linear section that is perpendicular to the third linear section. A disk changing system 105 used to transport disks into and out of the disk processing system 100.

A disk transport system transports the one or more disks (e.g., disk 120) on disk carriers (stocked in carrier stocker 119) in a process flow 111 among the various stations. In one embodiment, each disk carrier holds two disks (e.g., disk 120 and 121) such that two disks are processed within a particular station. Alternatively, a disk carrier may secure more or less than two disks.

It should be noted that, in alternative embodiments, disk processing system 100 may have more or less than the number of stations illustrated in FIG. 1. In one embodiment, the disk sputtering system 100 is an ANELVA disk sputtering system (e.g., C-3010, C-3040, C-3050, etc.) with one or more corner chambers modified in accordance with embodiments described herein to have one or more heaters that are used during the transport of disks through the corner chamber in a production mode. In alternative embodiments, the system 100 may be another type of sputtering system or disk processing system.

The corner stations C1-C4 operate to connect the differently oriented liner sections of the processing system. More specifically, corner stations C1-C4 connect a prior station whose exit is at an angle (e.g., perpendicular) with respect to the entry of a subsequent station within process flow 111. For example, the exit 131 of load station 101 is perpendicularly oriented with respect to the entry 141 of station P1. Corner station C1 includes a rotation assembly that re-orients a disk carrier received in one direction from load chamber 101 to a perpendicular direction for transport into station P1. Further details of the corner chamber are discussed below. It should be noted that the corner chambers discussed in regards to the embodiments of FIGS. 2A-5B may represent any one or more of corner chambers C1-C4.

Figure 2A:
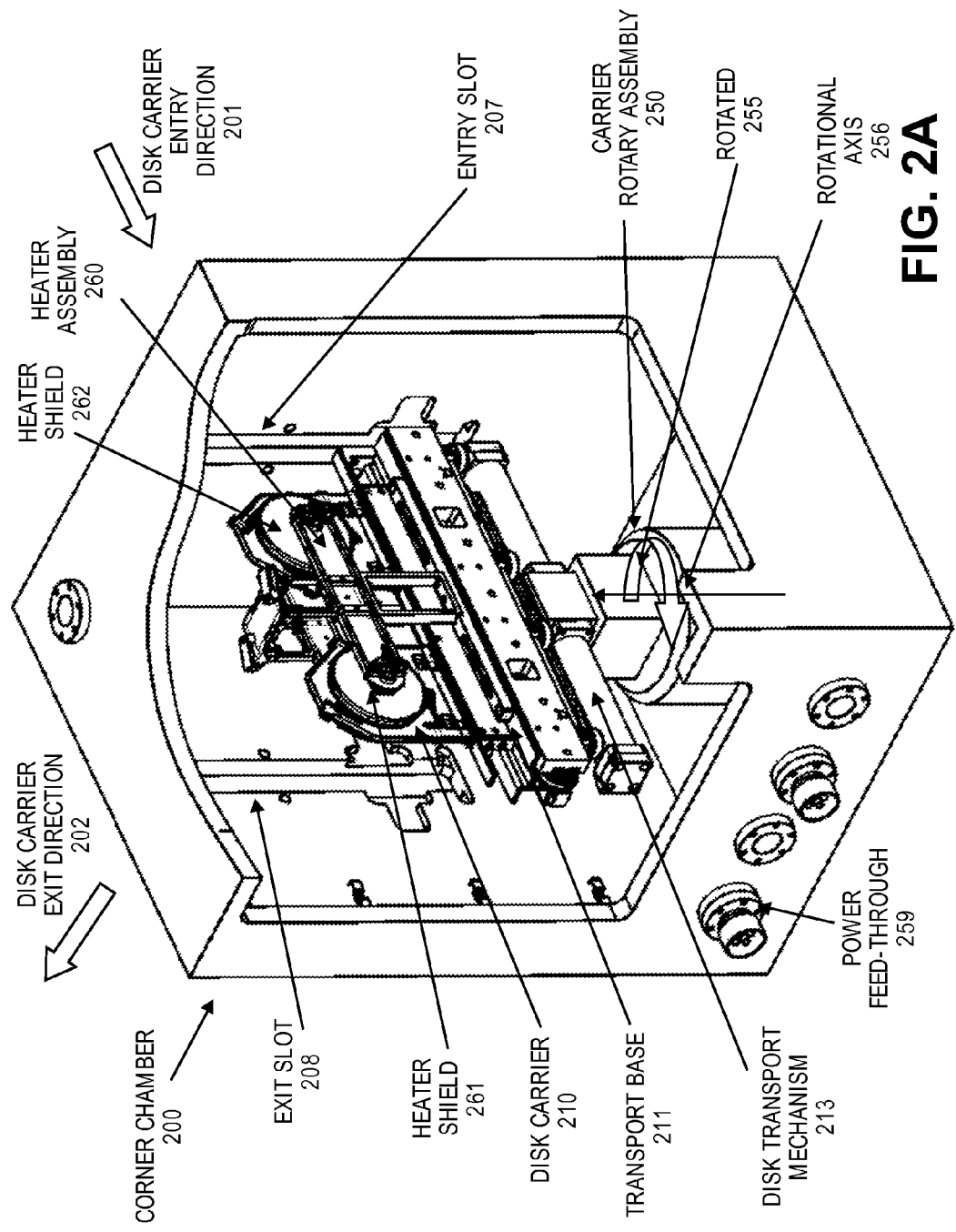
FIG. 2A is a cut away, perspective view illustrating one embodiment of a corner chamber having a heater assembly.

FIG. 2A is a cut away, perspective view illustrating one embodiment of a corner chamber having a heater assembly. In this embodiment, the disk carrier 210 enters the corner chamber 200 through an entry slot 207 in the side wall of the corner chamber 200. The carrier 210 is passed through the entry slot 207 on disk transport mechanism 213 and secured to the rotary assembly 250. In one embodiment, the disk carrier 210 has a magnetic transport base 211 that enables the carrier to be coupled on the disk carrier rotary assembly 250 using magnetic force. Alternatively, the disk carrier 210 may be coupled to the disk carrier rotary assembly 250 using other mechanisms. A disk transport mechanism to transport a disk carrier among stations is well known in the art; according, a description of such is not provided herein.

The disk carrier exit direction 202 of carrier 210 is perpendicular to the entry direction 201. As such, the disk carrier 210 is rotated 255, by rotary assembly 250, about rotational axis 256 approximately 90 degrees to enable the disk carrier 210 to exit the corner chamber 200 through exit slot 208. A carrier rotary assembly is known in the art; accordingly, further description is not provided. In one embodiment, a carrier rotary assembly as used in the ANELVA C-3040 disk sputtering system may be used. Alternatively, other types of carrier rotary assemblies may be used.

A heater assembly 260 is also coupled to the carrier rotary assembly 250 such that the disk carrier rotary assembly 250 is utilized to rotate the heater assembly 260 in conjunction with rotation of the disk carrier 210. As such, the disks secured within carrier 210 may be heated in the corner chamber while the carrier is rotated from the entry direction 201 to the exit direction 202. It should be noted that the heating may begin by activating power to the heater elements when the disk carrier 210 starts to enter the corner chamber through entry slot 207. The heating process continues when the carrier 210 is secured in the rotary assembly 250 (either at a same or different temperature) during rotation 255 of the disk carrier 210. The heating process may also continue until the disk carrier 210 exits the corner chamber 200 through exit slot 208.

In this embodiment, the heater assembly 260 is supported from below by mounting to the top of the carrier rotary assembly. In alternative embodiments, the heater assembly may be mounted to a rotary carrier assembly in other configurations, for example, as discussed below in relation to FIG. 4.

Figure 2B:
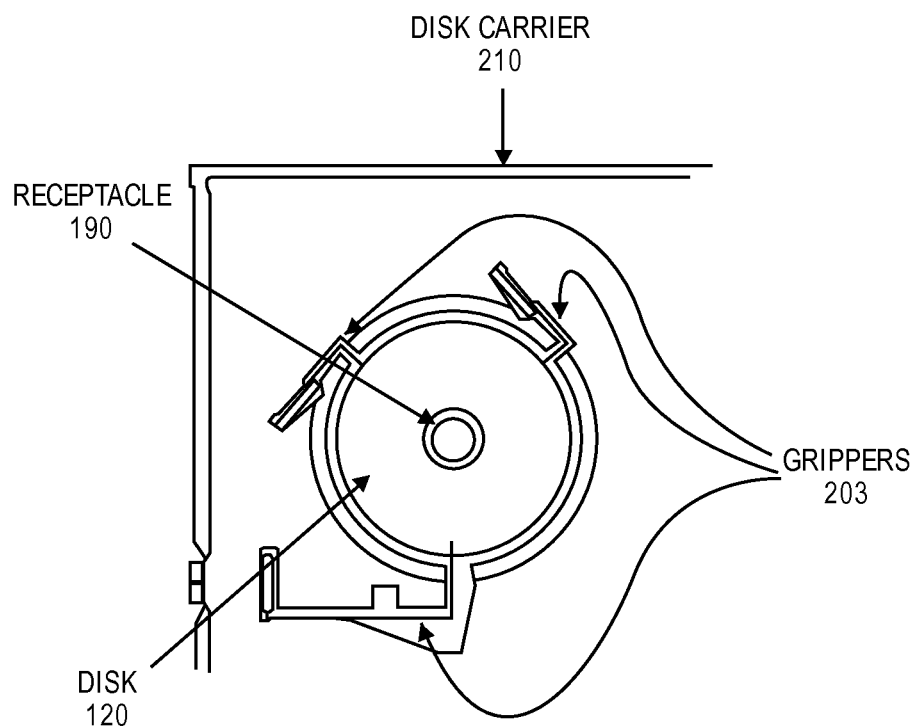
FIG. 2B is a planar view of a section of disk carrier according to one embodiment.

The heater assembly 260 may include heating element shields 261 and 262 that are mounted in the heater assembly to shield components from the heat generated by heating elements (e.g., seen in FIGS. 3A and 3B) positioned adjacent to the disks secured in the disk carrier. The corner chamber 200 also includes a power feed-through 259 to provide power connections to the heating elements. The power feed-throughs may be disposed on the corner chamber other than illustrated in FIG. 2A. In the embodiment illustrated in FIG. 2A, the heater shields 261 and 262 are at least as large as the heating elements and the disks secured within carrier 210. As such, the heating elements and the disks secured within carrier 210 are obscured from the view provided by FIG. 2A. FIG. 2B provides a planar view of a section of disk carrier 210 showing a disk 120 secured within a disk receptacle 190 of the carrier by grippers (which may also be referred to as pawls) 203. Although three grippers are illustrated in FIG. 2B, more or less grippers may be used. Alternatively, other types of disk securing mechanism may be used with disk carrier 210. In one embodiment, each receptacle of the disk carrier holds a single disk (e.g., which may be either a single sided disk or a double sided disk). Alternatively, each receptacle (e.g., receptacle 190) may hold two, single-sided disks that are secured back-to-back (i.e., each side to be processed facing outwards) in the disk carrier 210.

Figure 3A:
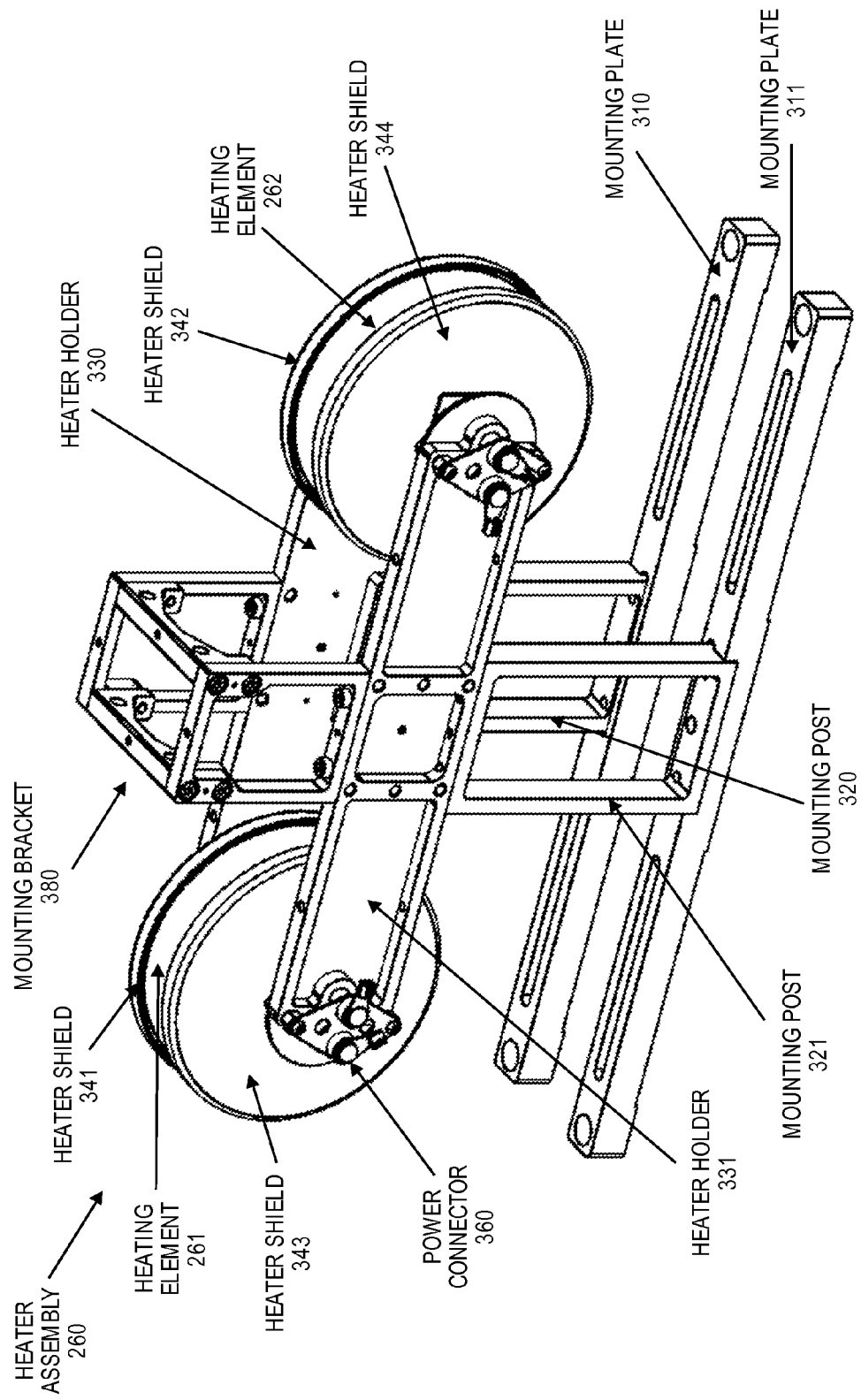
FIG. 3A is a perspective view and FIG. 3B is a cross sectional view illustrating a heater assembly according to one embodiment of the present invention.
Figure 3B:
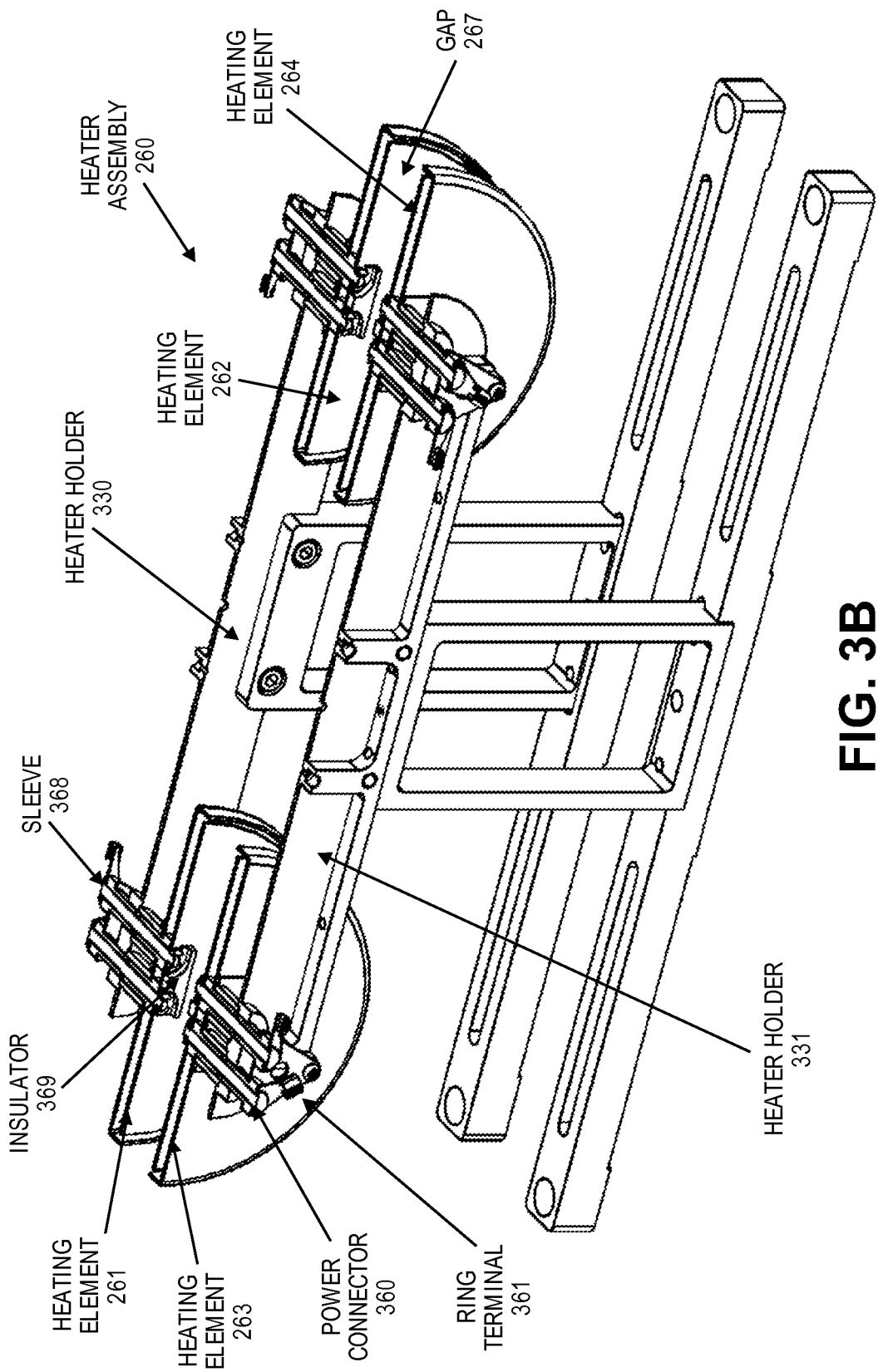

FIG. 3A is a perspective view and FIG. 3B is a cross sectional view illustrating a heater assembly according to one embodiment of the present invention. In this embodiment, the heater assembly 260 includes four heating elements 261, 262, 263 and 264. The heater assembly 260 is configured to position heating elements 261 and 262 on one side of the disk carrier 210 and position heating elements 263 and 264 on the opposite side of the disk carrier 210. As such, a gap 267 resides between opposing heating elements at least large enough to fit disk carrier 210 there between. In one embodiment, gap 267 may be approximately in a range of 5 millimeters (mm) to 20 mm. Alternatively, gap 267 may have other dimensions.

The heating elements 261 and 262 are coupled to heater holder 330 and heating elements 263 and 264 are coupled to heater holder 331. In one embodiment, the heating elements are pyrolytic boron nitride (PBN) heating elements. Alternative, the heater assembly 260 may have other types of heating elements, for example, infrared, quartz lamp, resistance, etc.

A heater shield 341 is coupled to the heater holder 330 in between the heating element 261 and the holder 330. Heater shield 342 is coupled to the heater holder 330 in between the heating element 262 and the holder 330. Likewise, a heater shield 343 is coupled to the heater holder 331 in between the heating element 263 and the holder 331, and a heater shield 343 is coupled to the heater holder 331 in between the heating element 264 and the holder 331. The heater shields 341-344 operate to protect other assembly components from the heat generated by heating elements 261-264. In one embodiment, the material used to construct the heater holders 330, 331 and the heater shields 341-344 is titanium due to its ability to withstand a high temperature and vacuum environment. Alternatively, heater holders 330, 331 and the heater shields 341-344 may be constructed from other materials, for example, molybdenum or tantalum. In another embodiment, the heater assembly may not include heater shields.

The heater assembly 260 also includes power connecters (e.g., power connector 360) for each of the heating elements 261-264 that pass through respective heater shields and connect to the respective a heating element. The power connectors are connected to power feed-through 259 with power wires coupled to respective ring terminals (e.g., ring terminal 361) of the power connectors. Each of the power connectors is surrounded by a sleeve (e.g., 368) and terminated by an insulator (e.g., 369) where coupled to a heating element. In one embodiment, the sleeves and the insulators may be constructed from ceramic. Alternatively, other electrical insulating and heat resistance materials may be used.

The heater holders 330 and 331 are coupled to a mounting bracket 380 that provides supporting structure for assembly. The heater holders 330 and 331 are coupled to the mounting plates 310 and 311, respectively, using mounting posts 320 and 321, respectively. The height of the mounting posts 320 and 321 is designed to position the heating elements adjacent to the disks of the disk carrier 210 when the heater assembly 260 is mounted to the rotary assembly 250. Mounting plates 310 and 311 are used to couple the heater assembly 260 to the carrier rotary assembly 250. It should be noted that the structural components of heater assembly 260, such as the mounting plates, mounting post and mounting bracket and heater holders may each be constructed as single pieces or multiple pieces. Moreover one or more of the structural components of heater assembly 260 may be formed as a unitary piece. Components of the heater assembly 260 may be coupled together using techniques known in the art, for example, welded, bolted, screwed, soldered, etc.

Figure 4:
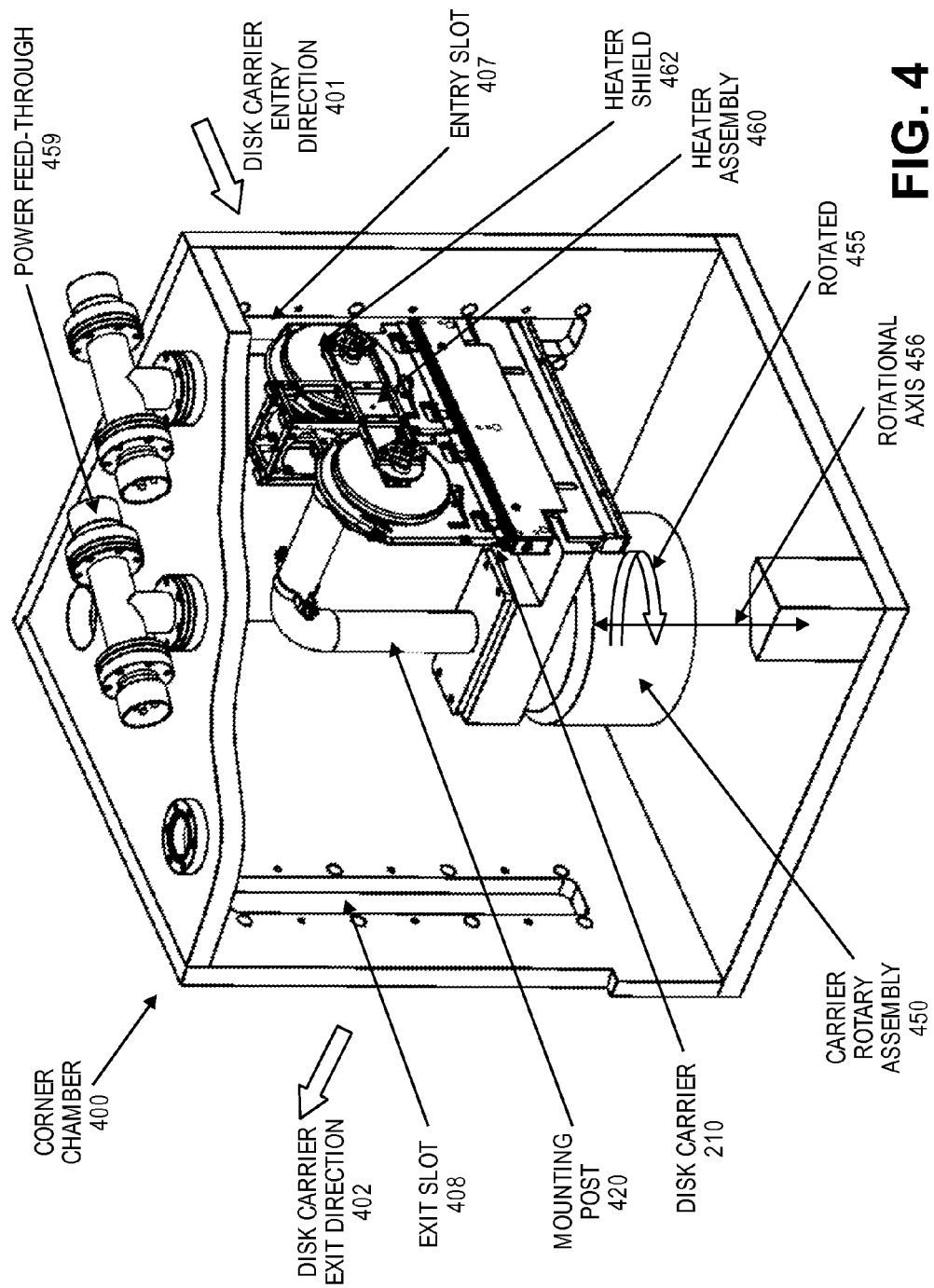
FIG. 4 is a cut away, perspective view illustrating an alternative embodiment of a corner chamber having a heater assembly.

FIG. 4 is a cut away, perspective view illustrating an alternative embodiment of a corner chamber having a heater assembly. In this embodiment, the disk carrier 210 enters the corner chamber 400 through an entry slot 407 in the side wall of the corner chamber 400. The carrier 210 is passed through the entry slot 407 by a disk transport mechanism (not shown) and secured to the rotary assembly 450. The disk carrier 210 operates in a manner similar to that discussed above in relation to FIG. 2A.

In this embodiment, the disk carrier exit direction 402 of the disk carrier is perpendicular to the entry direction 401. As such, the disk carrier 410 is rotated 455, by rotary assembly 450, about rotational axis 456 approximately 90 degrees to enable the disk carrier 210 to exit the corner chamber 400 through exit slot 408. In one embodiment, a carrier rotary assembly as used in the ANELVA C-3010 disk sputtering system may be used. Alternatively, other types of carrier rotary assemblies may be used.

A heater assembly 460 is also coupled to the carrier rotary assembly 450 using mounting post 420. In this manner, disk carrier rotary assembly 450 may be utilized to rotate the heater assembly 460 in conjunction with rotation of the disk carrier 210. In this embodiment, the heater assembly 260 is supported from the side by this use of an angle mounting post 420 mounting to the top of the carrier rotary assembly 450. In alternative embodiments, the heater assembly 460 may be mounted to a rotary carrier assembly 450 in other configurations.

The corner chamber 400 also includes a power feed-through 459 to provide power connections to the heating elements of the heater assembly 460. The power feed-throughs may be disposed at positions of the corner chamber other than illustrated in FIG. 4. In the embodiment illustrated in FIG. 4, the heater shields (e.g., 462) are at least as large as the heating elements and the disks secured within carrier 210. As such, the heating elements and the disks secured within carrier 210 are obscured from the view provided by FIG. 4.

Figure 5A:
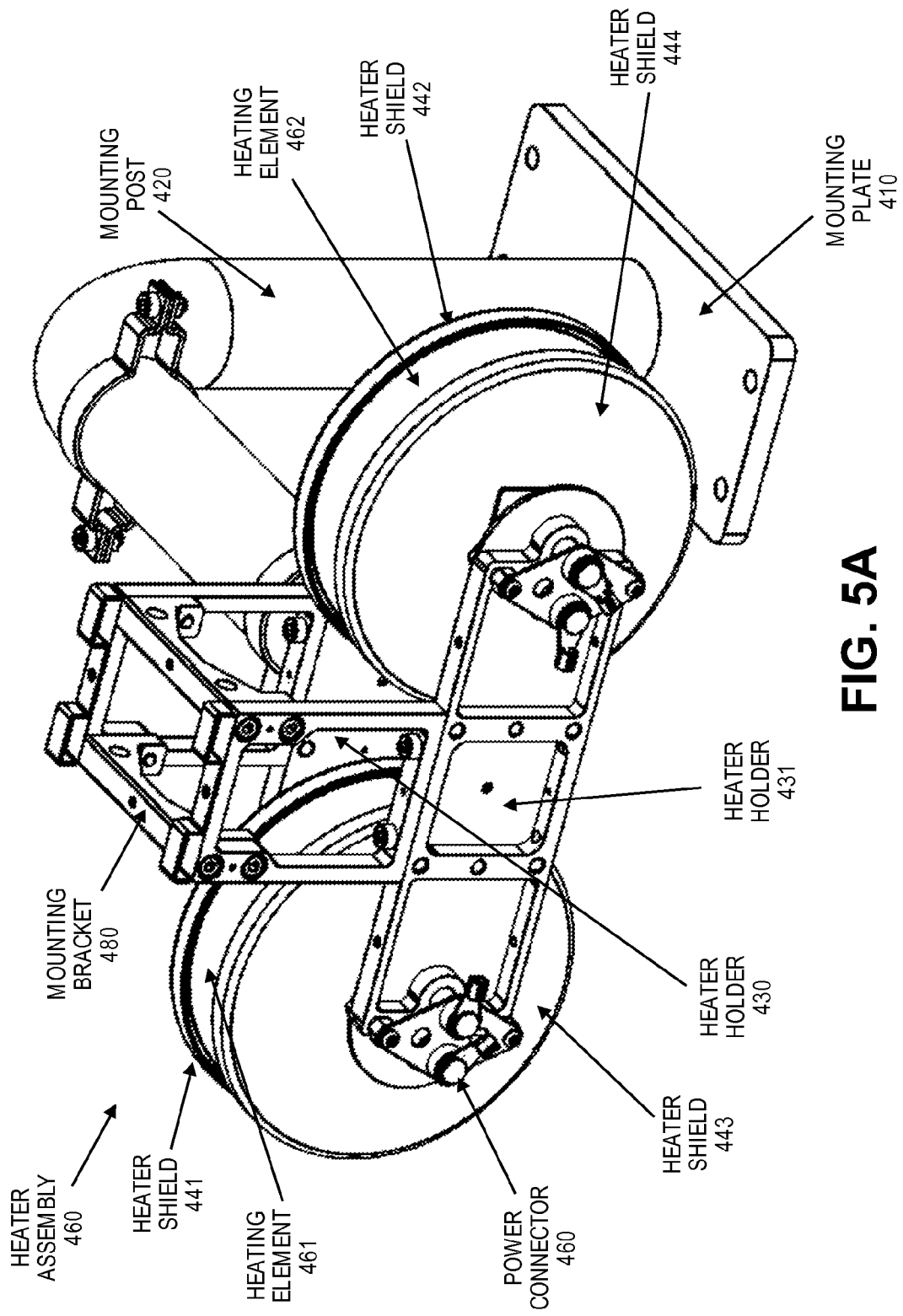
FIG. 5A is a perspective view and FIG. 5B is a cross sectional view illustrating a heater assembly according to an alternative embodiment of the present invention.
Figure 5B:
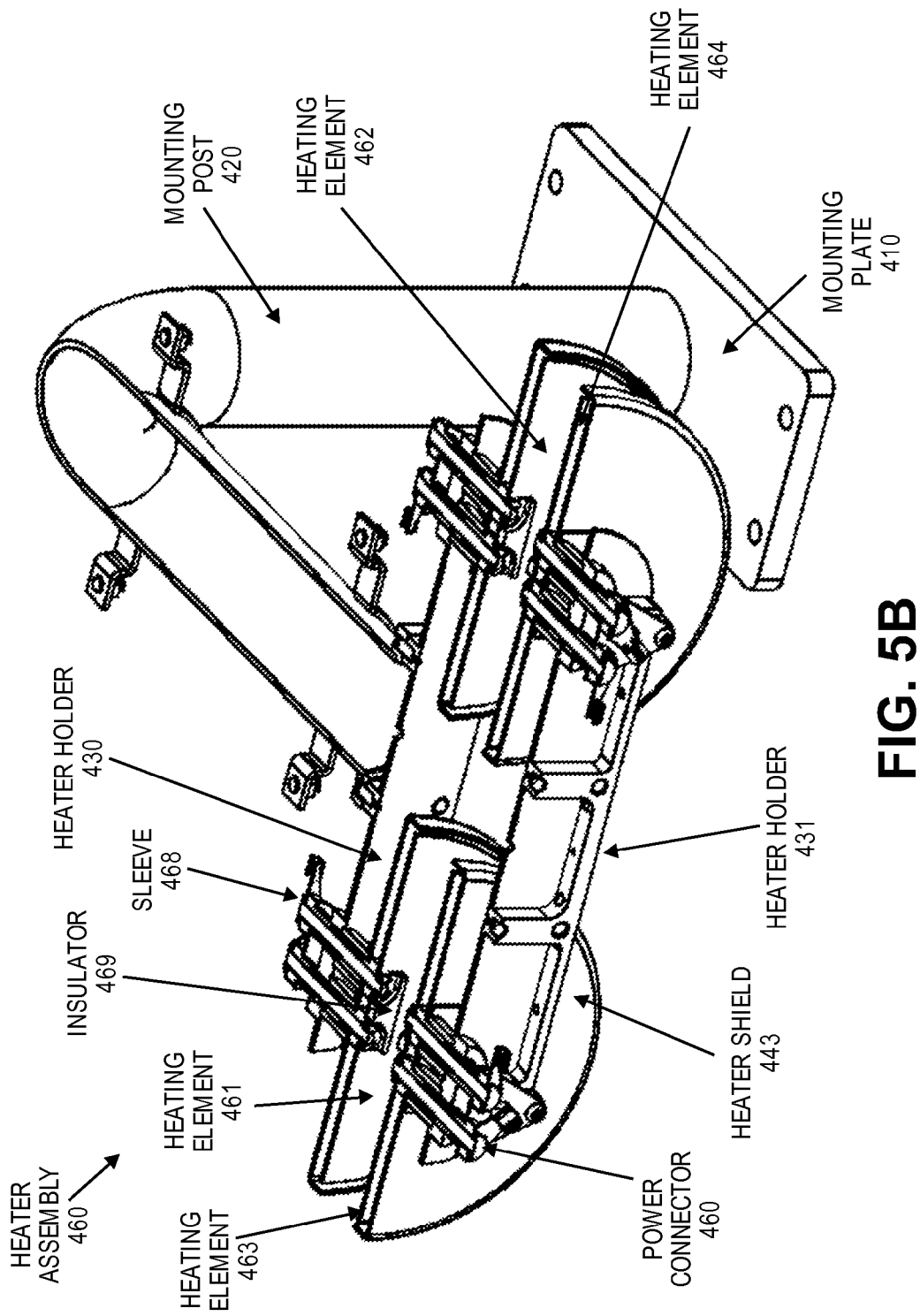

FIG. 5A is a perspective view and FIG. 5B is a cross sectional view illustrating a heater assembly according to an alternative embodiment of the present invention. In this embodiment, the heater assembly 460 includes four heating elements 461, 462, 463 and 464. The heater assembly 460 is configured to position heating elements 461 and 462 on one side of the disk carrier 210 and position heating elements 463 and 464 on the opposite side of the disk carrier 210. Similar to heater assembly 260 discussed above, a gap resides between opposing heating elements at least large enough to fit disk carrier 210 there between.

The heating elements 461 and 462 are coupled to heater holder 430 and heating elements 463 and 464 are coupled to heater holder 431. In one embodiment, the heating elements are pyrolytic boron nitride (PBN) heating elements. Alternatively, the heater assembly 460 may have other types of heating elements, for example, an infrared, quartz lamp, resistance, etc.

A heater shield 441 is coupled to the heater holder 430 in between the heating element 461 and the holder 430. Heater shield 442 is coupled to the heater holder 430 in between the heating element 462 and the holder 430. Likewise, a heater shield 443 is coupled to the heater holder 431 in between the heating element 463 and the holder 431, and a heater shield 443 is coupled to the heater holder 431 in between the heating element 464 and the holder 431. The heater shields 441-444 operate to protect other assembly components from the heat generated by heating elements 461-464. In one embodiment, the material used to construct the heater holders 430, 431 and the heater shields 441-444 is titanium due to its ability to withstand a high temperature and vacuum environment. Alternatively, heater holders 430, 431 and the heater shields 441-444 may be constructed from other materials, for example, molybdenum or tantalum.

The heater assembly 460 also includes power connecters (e.g., power connector 460) for each of the heating elements 461-464 that pass through respective heater shields and connect to the respective a heating element. The power connectors are connected to power feed-through 459. Each of the power connectors is surrounded by a sleeve (e.g., 468) and terminated by an insulator (e.g., 469) where coupled to a heating element. In one embodiment, the sleeves and the insulators may be constructed from ceramic. Alternatively, other electrical insulating and heat resistance materials may be used.

The heater holders 430 and 431 are coupled to a mounting bracket 480 (illustrated in FIG. 5A) that provides supporting structure for assembly and, in this embodiment, enables coupling of heater holder 431 to the mounting post 420. The heater holders 430 and 431 are coupled to mounting plate 410 using mounting post 320 420. The height of the mounting post 420 is designed to position the heating elements adjacent to the disks of the disk carrier when the heater assembly 460 is mounted to the rotary assembly 450. Mounting plate 420 is used to couple the heater assembly 460 to the carrier rotary assembly 450. It should be noted that the structural components of heater assembly 460, such as the mounting plate, mounting post and mounting bracket and heater holders may each be constructed as single pieces or multiple pieces. Moreover one or more of the structural components of heater assembly 460 may be formed as a unitary piece. Components of the heater assembly 460 may be coupled together using techniques known in the art, for example, welded, bolted, screwed, etc.

It should be noted that if the receptacles of the disk carrier 210 are each holding a single, double-sided disk or two, single-sided disks then both sides may be heated in the corner chambers 200 and 400 while the carrier 210 is rotated. In an alternative embodiment, the heater assemblies 260 and 460 may be configured with only half of the components illustrated in FIGS. 3A and 5A to provide heating on only a single side of a disk carrier.

In the foregoing specification, the present invention has been described with reference to specific exemplary embodiments thereof. It will, however, be evident that various modifications and changes may be made thereto without departing from the broader scope of the embodiments of the invention as set for in the appended claims. For example, although steps of embodiments of inventive methods may have been described in a specific order, one of skill in the art will understand that some of the steps described may occur simultaneously, in overlapping time frames, and/or in a different order from that described and claimed herein and fall within embodiments of the present invention. The specification and drawings are, accordingly, to be regarded in an illustrative rather than a restrictive sense.

What is claimed is:

1. A disk processing system, comprising:
a corner chamber comprising:
   a mounting assembly, comprising:
      a mounting plate;
      a mounting post coupled to the mounting plate; and
      a first heater holder coupled to the mounting post, wherein the first and second heater elements are coupled to the first heater holder;
   a heater assembly coupled to the mounting assembly, wherein the heater assembly comprise a first heating element, a second heating element, a third heating element and a fourth heating element;
   a first shield disposed between the first heating element and the first heater holder;
   a second shield disposed between the second heating element and the first heater holder;
   a mounting bracket coupled to the first heater holder; and
   a second heater holder coupled to the mounting bracket, wherein the third and fourth heating elements are coupled to the second heater holder in positions adjacent to the first and second heating elements, respectively, with a gap there between; and
   a carrier rotary assembly coupled to mounting plate of the mounting assembly, the carrier rotary assembly to rotate the heater assembly about a rotational axis of the carrier rotary assembly.

2. The system of claim 1, wherein each of the first and second heating elements comprise a pyrolytic boron nitride heating element.

3. The system of claim 1, wherein each of the first, second, third and fourth heating elements comprise a pyrolytic boron nitride heating element.

4. The system of claim 3, further comprising:
a third shield disposed between the third heating element and the second heater holder; and
a fourth shield disposed between the fourth heating element and the second heater holder.

5. The system of claim 1, further comprising a disk transport system to transport a disk carrier into the corner chamber in a first direction, the disk transport system to transport the disk carrier out of the corner chamber in a second direction.

6. The system of claim 5, wherein the second direction is perpendicular to the first direction.

7. The system of claim 1, further comprising:
a load chamber,
a plurality of processing chambers; and
a disk transport system coupled to the load chamber, the corner chamber, and the plurality of process chambers to transport a disk there among.

8. The system of claim 1, wherein the disk transport system is configured to transport disks, in sequence, from the load chamber to the corner chamber and then to the plurality of process chambers.

9. The system of claim 4, further comprising first, second, third and fourth power connectors respectively coupled to the first, second, third and fourth heating elements through respective first, second, third and fourth heater shields.

10. A method, comprising:
transporting a disk carrier securing one or more disks into a corner chamber; and
heating, in the corner chamber, the one or more disks using a heater assembly, wherein the corner chamber comprises:
   a mounting assembly, comprising:
      a mounting plate;
      a mounting post coupled to the mounting plate; and
      a first heater holder coupled to the mounting post, wherein the first and second heater elements are coupled to the first heater holder;
   the heater assembly coupled to the mounting assembly, wherein the heater assembly comprise a first heating element, a second heating element, a third heating element and a fourth heating element;
   a first shield disposed between the first heating element and the first heater holder;
   a second shield disposed between the second heating element and the first heater holder;
   a mounting bracket coupled to the first heater holder; and
   a second heater holder coupled to the mounting bracket, wherein the third and fourth heating elements are coupled to the second heater holder in positions adjacent to the first and second heating elements, respectively, with a gap there between; and
   a carrier rotary assembly coupled to mounting plate of the mounting assembly, the carrier rotary assembly to rotate the heater assembly about a rotational axis of the carrier rotary assembly.

11. The method of claim 10, further comprising rotating, in the corner chamber, the one or more disks and the heater assembly about a same rotational axis and wherein heating comprises heating the one or more disks while rotating.

12. The method of claim 10, wherein each of the heating elements comprise a pyrolytic boron nitride heating element.

13. The method of claim 11, wherein the one or more disks and the heater assembly are rotated about a rotational axis of the carrier rotary assembly.

* * * * *